United States Patent [19]

Cole et al.

[11] Patent Number: 5,040,047

[45] Date of Patent: Aug. 13, 1991

[54] ENHANCED FLUORESCENCE POLYMERS AND INTERCONNECT STRUCTURES USING THEM

[75] Inventors: Herbert S. Cole, Scotia; Renato Guida, Wynantskill; Yung S. Liu, Schenectady; Theodore R. Haller, Scotia, all of N.Y.

[73] Assignee: General Electric Company, Schenectady, N.Y.

[21] Appl. No.: 457,127

[22] Filed: Dec. 26, 1989

[51] Int. Cl.$^5$ ............................................ H02L 29/34
[52] U.S. Cl. ................................... 357/54; 357/52; 357/72; 357/30
[58] Field of Search ............... 357/8, 54, 72, 30 R, 357/30 L, 52; 350/354

[56] References Cited

U.S. PATENT DOCUMENTS

| 3,635,544 | 1/1972 | Stamm et al. | 350/354 |
|---|---|---|---|
| 4,379,070 | 4/1983 | Tick | 350/354 |
| 4,499,149 | 2/1985 | Berger | 357/7 |
| 4,556,605 | 12/1985 | Mogami et al. | 350/354 |
| 4,636,561 | 1/1987 | Hosoda | 350/354 |
| 4,652,598 | 3/1987 | Edelman | 357/72 |
| 4,929,837 | 5/1990 | DiVita et al. | 250/302 |

OTHER PUBLICATIONS

Sonntag, "Pinhole Detection by Electroluminescence," *IBM Technical Disclosure Bulletin*, vol. 12, No. 11, Apr. 1970, p. 1977.

*Primary Examiner*—Andrew J. James
*Assistant Examiner*—Courtney A. Bowers
*Attorney, Agent, or Firm*—William H. Pittman; James C. Davis, Jr.

[57] ABSTRACT

The fluorescent characteristics of a polymer material are modified by the addition of a fluorescent dye which is fluorescent in response to light in a particular portion of the spectrum to render it fluorescent in response to light in that particular portion of the spectrum.

10 Claims, 2 Drawing Sheets

ENHANCED FLUORESCENCE POLYMERS AND INTERCONNECT STRUCTURES USING THEM

RELATED APPLICATIONS

This application is related to application Ser. No. 07/456,421, filed concurrently herewith and entitled, "Laser Ablatable Polymer Dielectrics and Methods" by H. S. Cole et al. This application is incorporated herein by reference.

BACKGROUND OF THE INVENTION

1. Field of the Invention

The present invention relates to the field of polymers, and more particularly, to polymer dielectrics for use in electronic applications.

2. Background Information

There are a wide variety of polymer materials which may be used as dielectric layers and for other purposes in electronic and other applications. Each polymer composition has a set of physical properties such as density, water absorption tendency, dielectric constant, melting point or softening point, color, susceptibility to laser ablation, and so forth. A high density interconnect (HDI) system is disclosed in U.S. Pat. No. 4,783,695 to C. W. Eichelberger et al. Methods of fabricating such high density interconnect structures are disclosed in U.S. Pat. Nos. 4,714,516 and 4,835,704 to C. W. Eichelberger et al. This high density interconnect structure comprises integrated circuit chips having contact pads thereon mounted on a substrate with a dielectric layer adhesive bonded thereover. Via holes are formed through the dielectric layers and a patterned metallization layer is disposed on top of the dielectric layer and extends into the via holes to make electrical contact to the contact pads of the circuit chips.

This structure places special requirements on the dielectric materials. In particular, in order for the final structure to be usable over a wide temperature range, the dielectric layers must have high melting points and high thermal stability. They must also be laser ablatable by ultraviolet light in order to form the via holes through which different layers of metallization are connected. In the HDI system, laser processing (ablation, photoresist exposure, etc.) is normally done with one, or at most, two passes of the laser beam with a power ranging from 0.5 to 2.0 watts with a preferred maximum power level being about 1.5 watts. Thus, when a dielectric layer is characterized as being laser ablatable, it means that such a layer can be totally removed by one or two passes of a laser beam of this power level and when it is characterized as not being laser ablatable, it means that a layer is not completely removed by one or two passes of such a laser beam.

To minimize the complexity and cost of equipment for fabricating such high density interconnect structures, it is considered desired to be able to do all laser processing at a single frequency in order that only a single laser is required. Accordingly, preferred materials are those which may be processed at a laser frequency of 351 nm. This frequency was selected in accordance with the characteristics of desirable dielectric layers such as KAPTON ® polyimide available from DuPont de Nemours and the fact that there are commercial photoresists which can be processed at this frequency. ULTEM ® polyetherimide resin available from General Electric Company has been used as an adhesive layer in this high density interconnect structure for bonding KAPTON ® to the underlying structures. The ULTEM ® resin is laser ablatable at 351 nm. The ULTEM ® material has a melting point in the neighborhood of 220° C. or higher, depending on its specific formulation. This ULTEM ® high temperature adhesive layer is suitable for use in permanent structures.

The high density interconnect structure referred to above has many fine line electrical conductors in its metallization pattern. These electrical conductors preferably range from ½ mil to 2 mil in width and may be as long as several inches. The dielectric layers in this HDI structure are typically ½ mil to 1 mil thick. During the fabrication process, errors in the metallization pattern can be corrected without additional rework if they are discovered and corrected before the next dielectric layer is applied on top of the metallization layer containing the errors. Metallization which is disposed in a location where no metallization is desired may be removed by direct laser ablation, photoassisted etching operations or by the use of photoresist and plasma or wet etching of the undesired metal. Where gaps in the desired metal are present, additional metal may be deposited in those locations by laser induced deposition by decomposition of organometallic compounds where the deposition takes place only where the laser illuminates the dielectric layer.

If errors in the metallization pattern are not discovered until after deposition of successive dielectric and possibly metallization layers, then the structure may be repaired by removing the entire dielectric overlay structure and starting over. It is this repair process which must be used when errors in the metallization pattern are not found until electrical testing of the overall structure is undertaken. Consequently, there is the desire to accurately inspect each metallization layer prior to the application of the next dielectric layer. Printed circuit boards which have conductors which are typically 5 to 10 mils wide and may be as long as 20 inches or so, and have dielectric layers typically 2 to 7 mils thick, that is, 2 to 14 times thicker than the dielectric layers in an HDI structure can be inspected by using the model 2020 inspection apparatus which is commercially available from Lincoln Laser in Phoenix, Ariz. Unfortunately, such testing apparatus is at present incapable of properly inspecting HDI layers because of their extremely narrow conductors. The above Model 2020 inspection system relies on inherent luminescence of the dielectric materials used in circuit boards to produce a fluorescent output which is sufficient to enable the system to clearly distinguish between conductors and dielectric material. Many of the dielectric materials which are suitable for use in an HDI system are either non-fluorescent or so weakly fluorescent as to not provide a usable contrast ratio between dielectric and metal regions in the thicknesses in which those dielectrics are used in an HDI structure.

Unfortunately, because of the low level of fluorescence present in some of the dielectric layers in an HDI structure, this equipment is incapable of inspecting such structures accurately.

Consequently, improved methods of inspection for fine line multilayer conductor structures of the type present in an HDI system are needed.

OBJECTS OF THE INVENTION

A primary object of the present invention is to enable automatic inspection of HDI metallization layers to locate non-desired metallization configurations.

Another object of the present invention is to provide polymer materials for use in an HDI structure which provide sufficient fluorescent output in the thin layers in which they are present in an HDI structure to enable automatic inspection based on the contrast between dielectric and metal at the fluorescent frequency.

Another object of the present invention is to provide polymer materials which are either non-fluorescent or very weakly fluorescent with a sufficient fluorescent output to enable them to be used in structures which are automatically inspected using the fluorescent output from the dielectric.

Another object of the present invention is to provide a means for modifying the fluorescent characteristics of a polymer layer to render it sufficiently fluorescent to make the presence or absence of metal thereover detectable.

SUMMARY OF THE INVENTION

The above and other objects of the invention which will become apparent from the specification as a whole, including the drawings, are accomplished by modifying a polymer layer in which the basic polymer is either non-fluorescent or only weakly fluorescent in response to light in a particular portion of the spectrum by incorporating in the basic polymer a fluorescent dye which is more strongly fluorescent in response to light in that particular portion of the spectrum. The dye is included in the polymer in a sufficient concentration and distributed in a manner to render the modified polymer layer substantially uniformly fluorescent at a high enough intensity to enable automatic inspection of patterns disposed on the polymer layer by photoptical detection of the fluorescent light.

One method of forming such a layer comprises dissolving the polymer material and the dye in a solvent in which they are mutually soluble, coating a substrate with that solvent solution and removing the solvent to leave a layer of the modified polymer on the substrate. Alternatively, the dye may be added to a melt of the basic polymer or diffused or dissolved into an already existing layer of the basic polymer or may be added at the time of original formation of a polymer film or layer from precursor compounds. This modified polymer layer is preferably a solution of the basic polymer and the dye rather than a chemical combination of them in order to minimize the differences between the other physical properties of the modified and basic polymers. The dye may also be disposed in the form of a suspension of submicron particles. A high density interconnect structure preferably includes a dielectric layer comprised of the dye/polymer solution.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
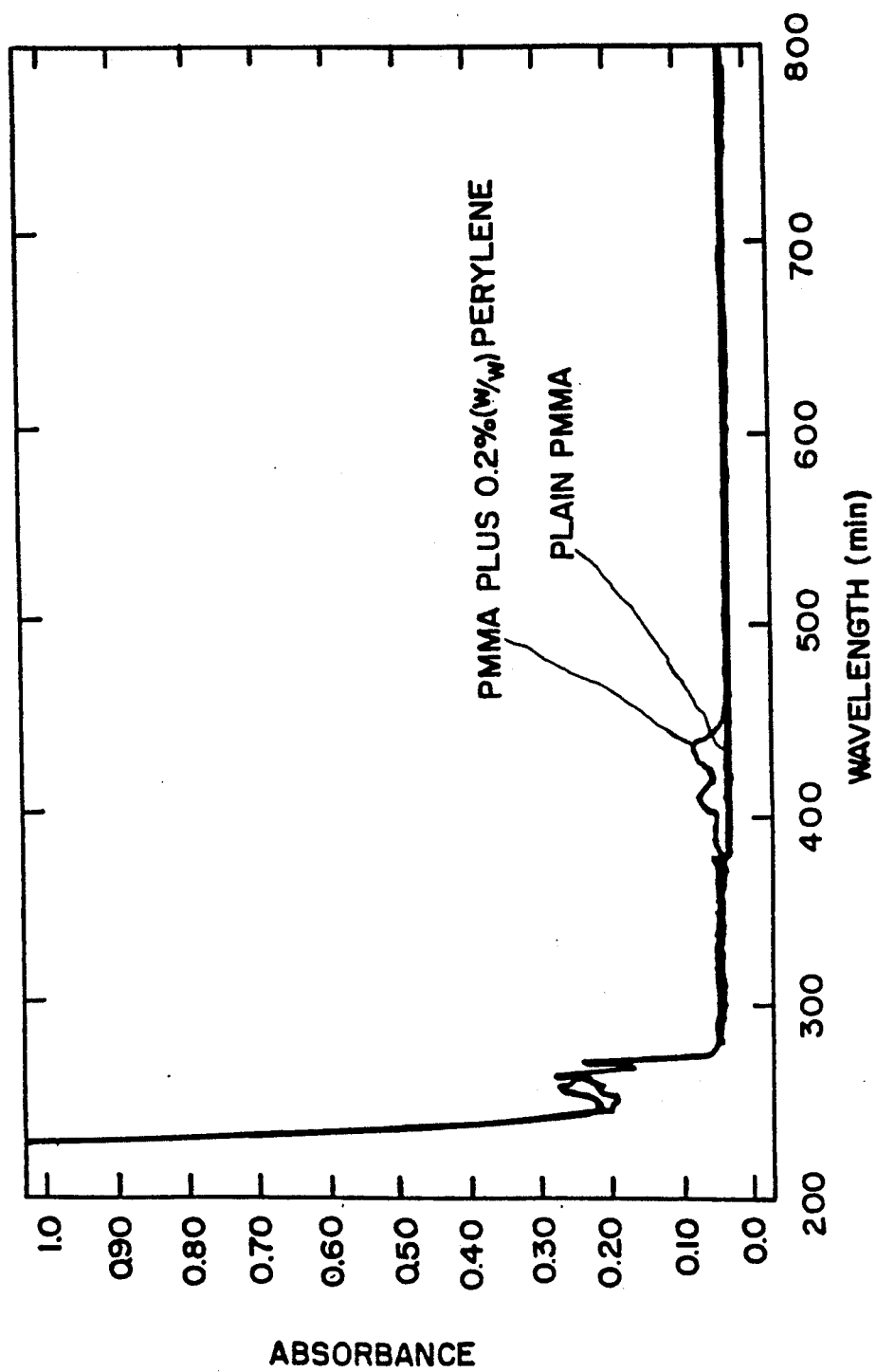
FIG. 1 illustrates the absorbance spectrum of a polymethylmethacrylate (PMMA) with and without a fluorescent dye dissolved therein.

It is well known in the dye art that the absorption spectrum of a dye may be modified by changing its structure to include different chemical groups having different absorption spectra. While the objective of the present invention of increasing the fluorescent intensity of a polymer over its natural fluorescent intensity could potentially be achieved by modifying the structure of an existing polymer in order to render it fluorescent in response to light in a particular portion of the spectrum, such a procedure is not preferred. First, typical polymer molecules have molecular weights in the vicinity of 50,000 and have molecular lengths on the order of 30,000Å. In contrast, a typical dye has a molecular weight of only several hundred and a length on the order of 30 angstroms or so. Consequently, in order to directly modify such a large polymer molecule to render it fluorescent, the basic building block of which the polymer chain is comprised would have to be modified or fluorescent groups would have to be attached to the polymer after its polymerization. The first of these procedures would result in modification of many of the physical properties of the polymer thereby, most likely, changing the polymer's desired properties. The second of these processes would also be likely to modify some of the desirable properties of the polymer and would also be a complicated process in itself.

Thus, in accordance with the present invention, a polymer material having a fluorescence characteristic in which it is either non-fluorescent or only weakly fluorescent in response to light in a particular portion of the spectrum is made more strongly fluorescent in response to that frequency of stimulating radiation by incorporating in the polymer a dye which is fluorescent in response to that frequency of stimulating radiation. This invention is applicable to thermoset and thermoplastic polymer materials. By thermoplastic we mean that upon multiple cycles of heating and cooling, the melting point of the polymer material remains substantially unchanged. That is, no substantial cross-linking of the material takes place during the heating, melting and resolidifying process. Such polymers are suitable as adhesive layers for bonding higher temperature polymers to substrates and may also themselves be used as layers to be bonded to substrates through the use of lower temperature adhesive layers. By thermoset materials we mean materials in which cross-linking takes place such that the material either no longer melts or melts at a much higher temperature than it did prior to its initial heating or its formation, as the case may be.

In order to form a polymer/dye layer in accordance with this invention, it is preferred that both the dye and the polymer be soluble in the same solvent. A solvent mixture of the polymer and the dye may then be formed in which the dye is uniformly distributed in the polymer. A coating formed using this solvent solution will have a uniform dye distribution in the polymer after the solvent has been driven off by heating or other processing. It is also desirable that the dye be soluble in the polymer in order that the dye will not separate from the polymer or precipitate in it. With the dye dissolved in the polymer, the dye is evenly distributed in locally-low concentrations with the result that the dye molecules are spaced apart and upon absorbing energy from the stimulating light become highly fluorescent. Where the dye is not soluble in the polymer, precipitation of the dye can result in the formation of clumps or particles of the dye which are large enough and randomly enough spaced, that the fluorescence of the polymer may be non-uniform which would result in unreliable inspection. However, fine particle dispersions of certain phosphorescent powders (with particle size on the order of a few microns) would also result in uniform fluorescence.

It is preferred that the dye be highly fluorescent in response to the stimulating light in order that small quantities of the dye in the polymer will be effective for rendering the polymer fluorescent, thereby minimizing the effect of the dye on the polymer's other physical characteristics.

Such polymers (molecular weight ~50,000) and dyes (molecular weight ~several hundred) may preferably be dissolved in a solvent having a relatively low boiling point (i.e. in the vicinity of 100° C. or less) such that the solvent can be easily removed by baking after the layer has been applied. For use in dielectric layers, it is preferred that the polymer have as high a resistivity as possible and thus, a non-ionic dye is desired in order to minimize changes in the polymer's dielectric characteristics. For the same reason, it is desirable to have the dye in very pure form. The dye should also be thermally stable at all temperatures to which it will be exposed during processing in order that the dye's desirable characteristics will not be destroyed during processing. For long term reliability, it is also desirable that the dye be thermally, photo and chemically stable in the environments in which it will be disposed, particularly where its decomposition products could be detrimental either to the polymer in which it is disposed or the adjacent materials.

A number of methods may be used to form a polymer layer of this type. First, the polymer and the dye may be dissolved in a solvent in which they are mutually soluble. That solvent solution may be coated on a substrate and the solvent removed by evaporation and baking in order to provide a polymer layer having a substantially uniform distribution of the dye in the polymer layer. Alternatively, in the case of thermoplastic polymers, the polymer itself may be melted and the dye added to the polymer melt after which the hot polymer may be formed into a layer or film in which the dye is substantially uniformly distributed. Further, an existing layer of the polymer material may have the dye diffused or dissolved into it by dissolving the dye in a solvent for both the dye and the polymer layer and coating the polymer layer with this solvent dye solution. After the dye has partially or completely dissolved into the polymer layer, the solvent is removed to leave a polymer layer having the dye distributed therein.

EXAMPLE 1

In this example, SPI-129, which is a siloxane polyimide solution which is commercially available from Huls, Albuquerque, N. Mex., was used as the plain polymer. Six different fluorescent dyes were mixed with this polymer. In each case, the dye concentration was substantially 0.1 % by weight of the polymer weight. In each case, the dye was mixed with the polymer and that mixture was spin coated on a silicon wafer. That coating was then dried by evaporation and baking at 100° C. The surface was then irradiated with an argon ion laser at 488 nm and the fluorescence measured. The fluorescence was measured using a photomultiplier tube connected to a scope which recorded the light intensity.

The first sample was the plain SPI-129. It had a relative fluorescence of 1.

The second sample contained the dye perylene which provided a relative fluorescence of 5.

The third sample contained the dye rubrene which exhibited a relative fluorescence of 2.

In the fourth sample, the dye was 6-carboxyfluorescein, which was not soluble in the SPI-129/solvent mixture.

In the fifth sample, the dye was diphenyl stilbene which was also insoluble in the SPI-129/solvent solution.

In sample six, the dye was cryptocyanine which was also insoluble in this SPI-129/solvent solution.

In the seventh sample, the dye was diindenoperylene which exhibited a relative fluorescence of 1.

The perylene, which produced the greatest relative fluorescence, is a quite desirable material because it is extremely stable due to its all aromatic, fused ring, structure and the lack of reactive groups on the molecule. Since this material shows such strong fluorescence when irradiated at 488 nm, it can be used in small concentrations which have a negligible effect on all of the other properties of the dielectric material. Presumably, the rubrene dye would have an increased relative fluorescence if it were included in the polymer in an increased weight percent. Other fluorescent dyes which meet the criteria for stability and solubility, will work equally well. These dyes have very little effect on the transmission (transparency) of the polymer at 488 nm because they are present in such small concentrations.

These dyes can be added to other dielectric polymers besides the SPI-129 siloxane polyimide such as polyetherimides, polyesters, polysulfones, benzocyclobutenes, polystyrene, polymethylmethacrylate and copolymers such as ethylene/vinylacetate or ethylene/maleic anhydride.

EXAMPLE 2

ELVAX 410 is a copolymer of ethylene and vinylacetate commercially available for E. I. DuPont de Nemours which has applications as a hot melt adhesive. This material softens well below 100° C. and is supplied in pellet form. A formulation was prepared to render this material fluorescent. 0.4 gram of perylene was mixed at about 120° C. with 10 grams of ELVAX 410 in the absence of solvents. At this temperature, the copolymer viscosity was low enough to allow uniform mixing and dissolution of the dye. After a few minutes of mixing, the uniform dye/copolymer blend (dyed copolymer) was cooled to room temperature. The dyed copolymer solidified during this cooling. A small amount of the resulting polymer blend was melted into a thin film on a glass substrate. A similar film of plain ELVAX 410 was also prepared (without fluorescent dye). A third sample consisted of a 1 mil film of KAPTON ® which was laminated to a glass substrate using plain ELVAX 410. The three samples were then irradiated at 488 nm and their relative fluorescence measured using a photomultiplier tube. The ELVAX 410 copolymer which contained the 0.4% perylene was a factor of 3 more fluorescent than the plain ELVAX 410 and a factor of 2 more fluorescent than the KAPTON film.

EXAMPLE 3

A phosphorescent powder, for example, can be dispersed in a polymer solution such as a solution containing 10% by weight of polymethylmethacrylate in toluene. By mixing in a blender, roll mill, or ultrasonic method, the phosphorescent material can be uniformly distributed in the polymer solution. The solution can be spin or roller coated, baked to remove the solvent, resulting in a thin polymer layer containing the phosphorescent material. The feasibility of this approached was established by evaluation of a phosphorescent glass which has phosphorescent particles dispersed in it. A phosphorescent glass plate was irradiated at 488 nm and the relative fluorescence measured and compared with the results of Example 2. The relative fluorescence was about 4 times greater than that measured for the plain Elvax 410 sample of Example 2. In accordance with our invention, similar results would be expected with the phosphorescent material dispersed in a polymer.

Figure 2:
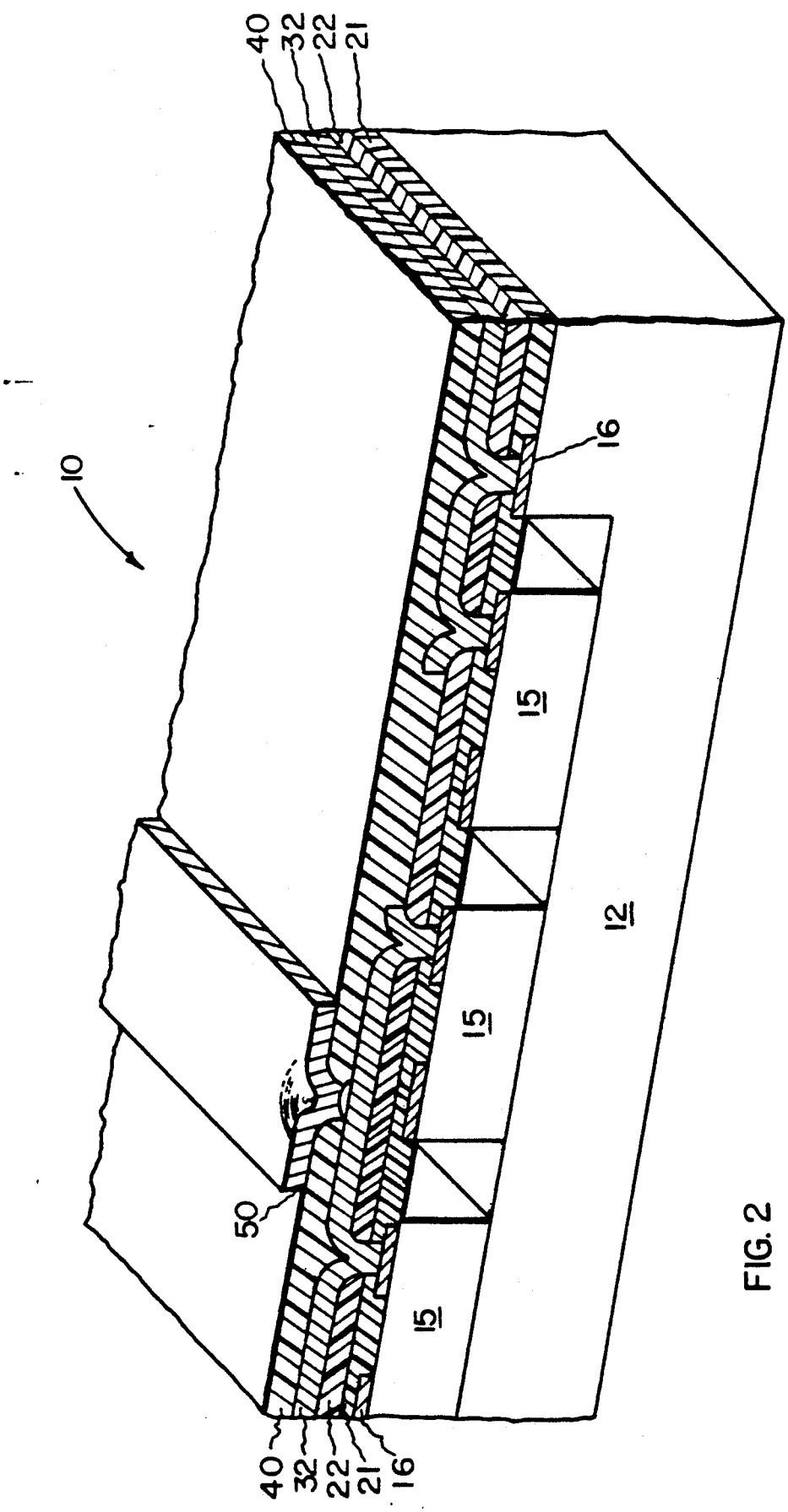
FIG. 2 illustrates a high density interconnect structure incorporating a modified polymer layer in accordance with the invention.

A high density interconnect structure 10 incorporating a dielectric layer in accordance with the present invention is illustrated in cross-section in FIG. 2 where a substrate 12 has integrated circuit chips 15 disposed in cavities therein. The integrated circuits 15 have contact pads 16 disposed on the upper surfaces thereof. A Kapton ® polyimide layer 22 is bonded to the top of the integrated circuit and the substrate by an adhesive layer 21 of p-phenylazophenol-dye-containing polyester in accordance with the aforementioned application Ser. No. 07/456,421 or ULTEM ® polyetherimide resin. Via holes are laser drilled in the dielectric layers 22/21 and an overlying metal layer 30 is disposed on the top of the dielectric layer and in the via holes and patterned to produce individual conductors 32. An additional dielectric layer 40 of a dyed SPI-129 siloxane polyimide in which the dye may preferably be Perylene is disposed over the conductive layer 30 and has via holes 42 disposed therein into which a second metal layer 50 extends to make contact to the first metal layer 30. This dielectric layer is highly fluorescent which facilitates inspection of the structure by fluorescence.

In this structure, the adhesive layer 21 may be a polyester having a melting point in the vicinity of 150° C. which is generally considered to be too low a temperature for use in a final product high density interconnect structure in a high temperature environment. However, this structure is ideal for intermediate testing prior to assembly of the final structure since the low melting point of the adhesive 21 facilitates the non-destructive disassembly of the structure at the end of testing as taught in U.S. Pat. No. 4,884,122 entitled "Method and Configuration for Testing Electronic Circuits and Integrated Circuit Chips Using a Removable Overlay Layer" (application Ser. No. 230,654 filed Aug. 5, 1988). Many other dyes and other polymers may be used in this high density interconnect structure in accordance with this invention.

While in FIG. 2 the HDI structure is illusfrated with the SPI-129 layer as the second layer of dielectric and as the only component of that second layer of dielectric, it should also be understood that the fluorescent dye could be added to the polyester of the layer 21 or the polyimide of the layer 22. Since the fluorescent dye is intended for the purpose of facilitating fluorescent inspection of the structure, the fluorescent dye may be incorporated in the layer 21 and not in the layer 22 and still provide the desired benefits, so long as the layer 22 is transparent or substantially transparent to both the stimulating wavelength of light and the fluorescent wavelength of light. This can be particularly beneficial where the layer 22 is a thermoset material, if that thermoset material is one which is not fluorescent and one in which it is difficult to incorporate a fluorescent dye. However, with KAPTON which is itself fluorescent, little increase in fluorescence was detected when perylene was added to a polyester adhesive layer 21. Alternatively, the fluorescent dye may be incorporated in the layer 22 and omitted from the layer 21. This may be done by adding the fluorescent dye to the polyimide of which the layer 22 is formed during the process of forming the polyimide film or layer itself. This technique is particularly desirable where the layer 22 is a thermoset material which is not soluble in common solvents.

While it is preferred that the dye be soluble in the polymer with the result that individual molecules of the dye are spaced from each other and substantially evenly distributed in the polymer layer, this invention can also be successful where the dye is not soluble in the polymer provided it can be distributed substantially uniformly through the polymer as minute particles.

While the above examples have been directed to the formation of the layer beginning with a basic polymer, it will be recognized that the dye material may be mixed with the basic polymer at the time of its manufacture with the result that the polymer pellets or powder or the solvent source solution of the polymer, as the case may be, will already incorporate a dye in accordance with this invention. This has the advantage of saving the user from the labor and expense of mixing a selected dye with the host polymer in order to provide the desired layer or film.

While the examples invovle the addition of a fluorescent dye, it will be recognized that a similar effect can be achieved by adding a sensitizer which aids in the absorption of incident light and the transfer of its energy to the fluorescing specifies or structure. A sensitizer may be added by itself to enhance any inherent fluorescence in the host polymer or it may be added with a fluorescent dye to enhance the fluorescence of that dye.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In a high density interconnect structure of the type comprising a substrate having conductive regions thereon, one or more polymer dielectric layers disposed thereover and having apertures therein, one or more patterned conductive layers overlying selected ones of said dielectric layers and extending into selected ones of said apertures, the improvement comprising:
   at least one of said dielectric layers comprising a polymer which is substantially nonfluorescent in response to light in a particular portion of the spectrum whereby said polymer is not significantly fluorescent in response to light in said particular portion of the spectrum,
   a fluorescent dye which is fluorescent in response to light in said particular portion of the spectrum, and said dye being distributed in said polymer in sufficient quantity to render said at least one dielectric layer significantly fluorescent in response to light in said particular portion of the spectrum.

2. The improvement recited in claim 1 wherein:
said dye is substantially uniformly distributed in said polymer.

3. The improvement recited in claim 1 wherein:
said polymer is selected from the group consisting of siloxane polyimides, polyetherimides, polyesters, polysulfones, benzocyclobutenes, polystyrene, polymethylmethacrylate, ethylene/vinylacetate and ethylene/maleic anhydride.

4. The improvement recited in claim 3 wherein:
said dye is selected from the groups consisting of perylene, rubrene and diindenoperylene.

5. The improvement recited in claim 1 wherein:
said dye is selected from the groups consisting of perylene, rubrene and diindenoperylene.

6. In a high density interconnect structure of the type comprising a substrate having conductive regions thereon, one or more polymer dielectric layers disposed thereover and having apertures therein, one or more patterned conductive layers overlying selected ones of said dielectric layers and extending into selected ones of said apertures, the improvement comprising:
one or more of said dielectric layers including a fluorescence-enhancing dye which is fluorescent in response to light in a particular portion of the spectrum.

7. The high density interconnect structure recited in claim 6 wherein:
said dielectric is selected from the group consisting of siloxane polyimides, polyetherimides, polyesters, polysulfones, benzocyclobutenes, polystyrene, polymethylmethacrylate, ethylene/vinylacetate and ethylene/maleic anhydride.

8. The high density interconnect structure recited in claim 7 wherein:
said dye is selected from the groups consisting of perylene, rubrene and diindenoperylene.

9. The high density interconnect structure recited in claim 6 wherein:
said dye is selected from the groups consisting of perylene, rubrene and diindenoperylene.

10. The improvement recited in claim 6 wherein:
the polymer of one of said fluorescent-dye-containing dielectric layers melts at less than 200° C.; and
said fluorescent-enhancing dye is thermally stable over a range of temperatures above said melting point.

* * * * *